United States Patent [19]

Plocher

[11] Patent Number: 4,478,673
[45] Date of Patent: Oct. 23, 1984

[54] PRESSING APPARATUS WITH MULTI-PLATEN OR TIERED PRESSES

[75] Inventor: Werner Plocher, Horb, Fed. Rep. of Germany

[73] Assignee: Maschinenfabrik Lauffer GmbH & Co. KG., Horb, Fed. Rep. of Germany

[21] Appl. No.: 436,965

[22] Filed: Oct. 27, 1982

[30] Foreign Application Priority Data

Nov. 5, 1981 [DE] Fed. Rep. of Germany ....... 3143913

[51] Int. Cl.³ ............................................. B32B 31/00
[52] U.S. Cl. .................................... 156/498; 100/196; 100/218; 156/539; 156/580; 414/277
[58] Field of Search ................ 100/196, 218; 156/498, 156/539, 580; 414/28, 222, 277

[56] References Cited

U.S. PATENT DOCUMENTS

| | | | |
|---|---|---|---|
| 3,339,757 | 9/1967 | Nagaoka | 100/196 X |
| 3,664,524 | 5/1972 | Yamauchi | 100/196 X |
| 3,761,337 | 9/1973 | Hütter | 100/196 X |
| 4,065,003 | 12/1977 | Hostettler | 100/196 X |
| 4,348,144 | 9/1982 | Nelson | 414/277 |

Primary Examiner—Robert A. Dawson
Attorney, Agent, or Firm—Michael J. Striker

[57] ABSTRACT

The invention relates to a pressing apparatus with multi-platen or tiered presses which has a charging basket 1 capable of receiving more tools with material to be pressed than there are tiers in the presses H, K. The capacity of the discharging basket 2 exceeds that of the charging basket 1 by the number of tiers in the tiered presses H, K. The charging basket 1 and the discharging basket 2 are vertically adjustable. The invention makes it possible to stock several tools in the charging basket 1. The tools can then pass through the presses to the discharging basket 2 automatically.

13 Claims, 4 Drawing Figures

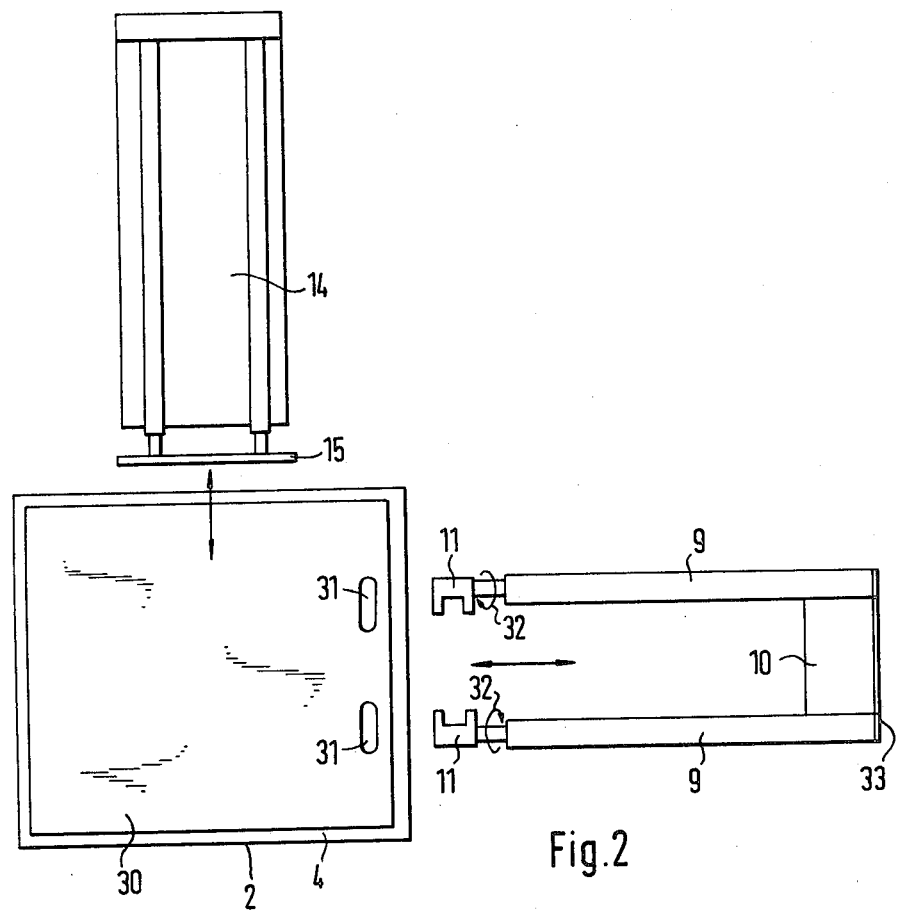
Fig.2
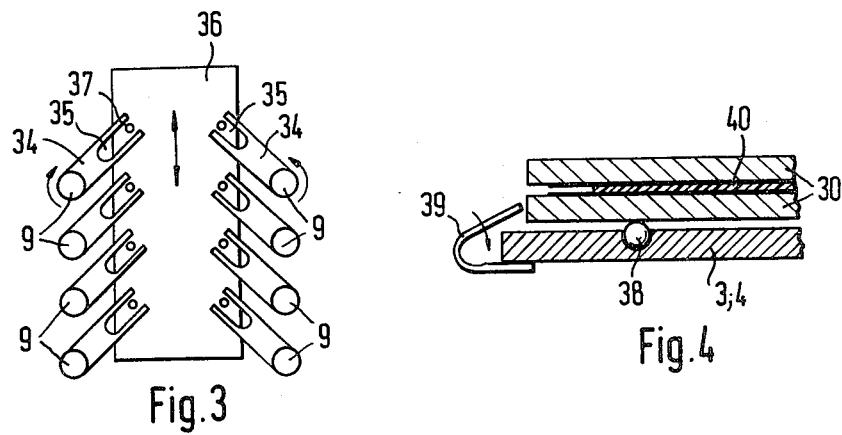
Fig.3
Fig.4

PRESSING APPARATUS WITH MULTI-PLATEN OR TIERED PRESSES

The present invention relates to a pressing apparatus comprising a heating press and a cooling press which are designed as multi-platen or tiered presses, and a loading and an unloading facility which permit the pressing apparatus to be loaded and unloaded from the front and transfer the tools with the work contained therein through the pressing apparatus, particularly for pressing multilayer printed-circuit boards.

Pressing apparatuses with multi-platen or tiered presses are known which are suitable for the manufacture of multilayer printed-circuit boards and multi-wire arrangements. These conventional pressing apparatuses have a loading facility into which a number of tools equal to the number of tiers in the subsequent heating press can be placed. The tools, which consist essentially of two metal plates between which multilayer printed circuit boards are placed, for example, are pushed at the front end into compartments which are arranged one above another and on a level with the associated tier of the adjacent heating press. The individual compartments are not vertically adjustable. The unloading facility in these conventional pressing apparatuses is of a corresponding design, i.e., its number of compartments is equal to the number of tiers in the presses, and the compartments are not vertically adjustable, either.

This prior art pressing apparatus has the disadvantage that no supply of tools can be introduced into the loading facility, and that the unloading facility must be constantly discharged in order that pressed boards can leave the cooling press.

The object of the invention is to provide a pressing apparatus which permits tools to be stored both in the loading facility and in the unloading facility.

To attain this object in a pressing apparatus of the above kind, the loading facility has a charging basket with several shelves, and the unloading facility has a discharging basket with several shelves, and both the charging basket and the discharging basket are open in front and at the side and vertically adjustable.

The adjustabilitiy of the baskets makes it possible to provide the baskets with more shelves than there are tiers in the presses. The use of shelves permits the tools to be introduced from the front into the charging basket, from where they are then pushed out laterally toward the heating press. The tools for which the pressing is finished are introduced into the discharging basket at the side. Removal from the discharging basket takes place at the front again.

Particularly advantageously, the pressing apparatus is designed so that the charging basket can be lowered to the point that its upper edge lies below the lowest tier of the heating press. With the charging basket lowered to the lowest point, there is free access to the tools in the heating press. The charging basket may be filled up with tools without the access to the heating press being blocked thereby.

In a preferred embodiment of the invention, the loading facility has a movable vertical feeding arm with several horizontal push rods with which the tools can be pushed from the heating press to the cooling press or from the charging basket to the heating press alternatively. With the charging basket lowered to the lowest point, the feeding arm can move over the charging basket up to the heating press.

To ensure good movability of the tools in the baskets toward all sides, balls serving to support the tools rest in and are distributed over the surfaces of the shelves.

In another preferred embodiment, the number of shelves in the discharging basket exceeds the number of shelves in the charging basket by the number of tiers in the tiered presses. This makes it possible to mechanize the pressing process for the tools contained in the cooling press, the heating press, and the charging basket without any tools having to be removed from the discharging basket during this process. The discharging basket only has to be emptied before, so that it can receive the tools used for pressing, the last group of tools remaining in the cooling press after termination of the pressing process.

For the manufacture of multilayer printed-circuit boards, during which about 4 to 6 tiers are present in the presses, the baskets are preferably designed so that the number of shelves in the charging basket is twice the number of tiers in the heating press, and that the number of shelves in the discharging basket is three times the number of tiers in the cooling press.

In a further embodiment, the shelves in the discharging basket are spaced a shorter distance apart than those in the charging basket, and the charging basket and the discharging basket have the same external dimensions. The unloading facility thus need not be higher than the loading facility.

For the transport of the tools from the cooling press to the discharging basket, the unloading facility has a horizontally movable, vertical withdrawing arm with horizontal gripping rods which convey the tools, by means of grippers provided at their front ends, from the cooling press to the discharging basket. To accomplish this, the gripping rods are moved through the discharging basket up to the cooling press.

Since the shelves in the discharging basket are spaced a short distance apart, in a further embodiment of the invention, the gripping rods are rotatable about their axes, and their grippers are U-shaped claws which are caused to engage with openings in the tools by rotating the gripping rods. Thus the spacing between the individual shelves needs to be only so large that the gripping rods can pass through.

The individual tools may have a weight of more than 100 kg, so that the baskets are of considerable weight if loaded to capacity. For this reason, each of the two baskets is connected with an associated counterbalance weight by means of a steel rope attached to it at the top and running over guide pulleys. The expenditure of energy for lifting the baskets is thus reduced considerably.

In order that the baskets are open on all sides, the upper part and the lower part of each of the baskets are connected at the outer corners by vertical steel braces. For lifting and lowering the baskets, racks may be mounted in the regions of these steel braces.

In a further embodiment of the invention, therefore, the lifting and lowering of the baskets is effected via pinions which mesh with vertical racks attached to the baskets.

For discharging the discharging basket, a pushing unit is provided which pushes the tools out of the discharging basket toward the front one at a time.

The vertical adjustability of the discharging basket permits the pushing unit to have a horizontal pusher which is located at a given height to which the respective tool to be pushed out of the discharging basket is lowered.

Furthermore, safety members are attached to the shelves.

They prevent the tools from rolling out of the baskets.

The invention will now be explained in greater detail with reference to the accompanying drawings, in which:

FIG. 2 shows part of the pressing apparatus in a top view;

FIG. 3 shows the actuating mechanism for the gripping rods, and

FIG. 4 is a side view of a shelf.

Figure 1:
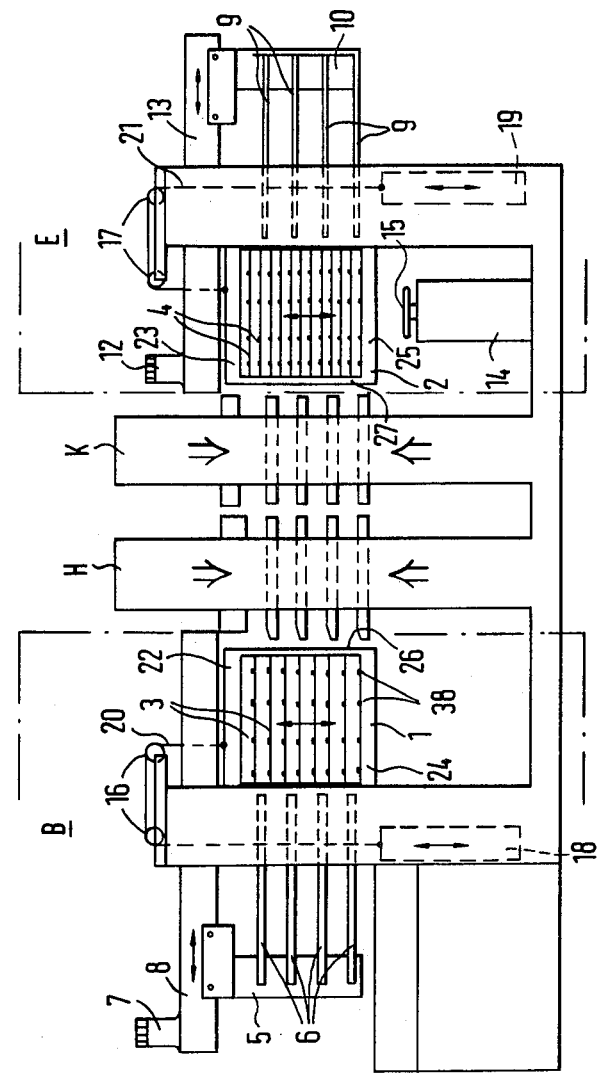
FIG. 1 is a front view of a pressing apparatus in accordance with the invention.

FIG. 1 is a simplified representation of a pressing apparatus in accordance with the invention. The apparatus consists of a loading facility B, a heating press H, a cooling press K, and an unloading facility E. The loading facility B has a charging basket 1, and the unloading facility E a discharging basket 2. The number of shelves 3 in the charging basket 1 is smaller than the number of shelves 4 in the discharging basket 2 by the number of tiers.

To enable the tools lying on the shelves 3 to be pushed into the adjacent heating press H, a feeding arm 5 with horizontal push rods 6 is movable in the direction of the heating press H. To this end, the feeding arm 5 is driven by a motor 7 via chains (not shown). The motor 7 and the guide and suspension of the feeding arm 5 are mounted on a beam 8. As the feeding arm 5 moves to the right, i.e., toward the heating press H, the tools that are on a level with the push rods 6 are pushed out of the charging basket 1 into the heating press H.

When the pressing in the heating press H has been completed, the charging basket 1 is fully lowered to enable the push rods 6 of the feeding arm 5 to move to the heating press H unhindered. With the push rods 6, the tools contained in the heating press and, of course, the pressed parts therein are pushed over to the cooling press K. Then, the feeding arm 5 moves back, the charging basket 1 is raised, and the next group of tools can be pushed into the heating press H by means of the push rods 6.

The tools are pulled out of the cooling press K by gripping rods 9. The gripping rods 9 are rotatably mounted on a withdrawing arm 10. The withdrawing arm 10 is moved to the left, i.e., toward the cooling press K, so that its gripping rods 9 reach through the discharging basket 2. The front ends of the gripping rods 9 are provided with U-shaped claws 11 which engage with openings in the tools after a rotation by 90°. The design of the claws 11 is apparent from FIG. 2. The withdrawing arm 10, as the feeding arm 5, is driven by a motor 12 mounted together with the withdrawing arm 10 on a beam 13.

After tools have been pulled into the discharging basket 2 by means of the gripping rods 9, the discharging basket 2 can be lowered to the discharging position. For the discharge, there is provided a pushing unit 14 with which the tools can be pushed out of the discharging basket 2 toward the front-i.e., out of the picture plane-one at a time. To this end, the pushing unit 14 has a horizontal pusher 15, which can be actuated hydraulically.

To facilitate the vertical motion of the baskets 1, 2, the latter are connected to counterbalance weights 18, 19 by steel ropes 20, 21 or chains running over guide pulleys 16, 17.

In order that the baskets 1, 2 are open on all sides, their upper parts 22, 23 and their lower parts 24, 25 are connected only at the corners by steel braces 26 and 27, respectively.

FIG. 2 is a simplified top view of parts of the pressing apparatus.

A tool 30 lies on a shelf 4 of the discharging basket 2. It has two openings 31, with which the U-shaped claws 11 can move into engagement. To accomplish this, the claws 11 are moved vertically up to the openings 31 and then rotated by 90° into the openings 31. The direction of rotation is indicated by two arrows 32.

At the back of the withdrawing arm 10 is an actuating mechanism 33 with which the gripping rods are rotated. FIG. 3 illustrates the operation of this actuating mechanism 33.

Attached to the rear ends of the gripping rods 9 are vertically projecting levers 34, each of which has a recess 35 enclosing a pin 37 mounted vertically on a plate 36. If the plate 36 is moved downwards, the gripping rods 9 will rotate in the direction indicated by arrows.

FIG. 4 is a sectional side view of a shelf 3, 4 with a tool 30 resting thereon. The drawing shows one of the balls 38 recessed in the shelf 3; 4. The tool 30 rests on the balls 38, so that it can be easily moved toward all sides.

To prevent the tool 30 from rolling out on one or more sides of the shelves 3, 4, safety members 39 are attached at these sides. The safety members 39 are resilient, so that they are forced downward when a tool 30 is pushed in. After the tool 30 has been completely pushed onto the shelve 3, 4, the safety member 39 will return to the starting position shown.

The shelves 3 of the charging basket 1 may be provided with safety members 39 on three sides. Only the side facing the heating press H remains without safety members, so that the tools 30 can be pushed over to the heating press H. The discharging basket 2 needs to be free of safety members 39 at its front side only.

FIG. 4 also shows the work 40 in the tool 30. In the present case, this is a multilayer printed-circuit board.

I claim:

1. A pressing apparatus for the manufacture of multilayer printed circuit boards, comprising:
    a multitiered heating press and a multitiered cooling press;
    a loading and an unloading facility for transferring tools, with a pressing material contained therebetween, through the pressing apparatus;
    a vertically displaceable charging basket having an upper edge and a plurality of shelves equally spaced from each other and whose number is equal to an integer multiple of at least two times the number of tiers in said multitiered heating press, said vertically displaceable charging basket being disposed in said loading facility and having the ability to be lowered so far that its upper edge lies under the lowermost tier of said multitiered heating press; and
    a horizontally movable vertical feeding arm also disposed in said loading facility and having a plurality of horizontal push rods corresponding in number to the number of tiers in said multitiered presses so as to provide for a synchronous insertion of the tools from the charging basket into all of the tiers of said multitiered heating press and said multitiered cooling press alternately.

2. The pressing apparatus as claimed in claim 1; further comprising a vertically displaceable discharging basket disposed in said unloading facility and having a plurality of shelves greater in number than the number of shelves of said charging basket by the number of tiers of said multitiered presses.

3. The pressing apparatus as claimed in claim 2; further comprising a horizontally movable vertical withdrawing arm also disposed in said unloading facility and having horizontal gripping rods whose front ends contain grippers to transport the tools, with the pressing material loaded therebetween, from said multitiered cooling press into said discharging basket.

4. An apparatus as claimed in claim 2, wherein said shelves of said charging and discharging baskets have surfaces; further comprising balls that serve to support the tools, and rest in and are distributed over said surfaces of said shelves of said charging and discharging baskets.

5. An apparatus as claimed in claim 2, wherein the number of said shelves in said charging basket is twice the number of tiers in said, heating press (H), and that the number of said shelves in said discharging basket is three times the number of tiers in said cooling press.

6. An apparatus as claimed in claim 2, wherein said shelves in said discharging basket are spaced a shorter distance apart than those in said charging basket, and that said charging basket and said discharging basket have the same external dimensions.

7. An apparatus claimed in claim 3, wherein said tools have openings, said gripping rods being rotatable about their axes, and their grippers are U-shaped claws which are caused to engage with said openings in the tools by rotating said gripping rods.

8. An apparatus as claimed in claim 2, wherein each of said charging and discharging baskets is connected with an associated counterbalance weight by means of a steel rope attached to it at the top and running over guide pulleys.

9. An apparatus as claimed in claim 2, wherein said charging and discharging baskets have upper and lower parts, outer corners and said upper part and said lower part of each of said charging and discharging baskets are connected at said outer corners by a vertical steel brace.

10. An apparatus as claimed in claim 2, wherein the lifting and lowering of said charging and discharging baskets is effected via pinions which mesh with vertical racks attached to said charging and discharging baskets.

11. An apparatus as claimed in claim 2, wherein for discharging said discharging basket, a pushing unit is provided which pushes the tools contained in said discharging basket out of said discharging basket towards the front, one at a time.

12. An apparatus as claimed in claim 11, wherein said pushing unit has a horizontal pusher which is mounted at a given height, to which the respective tool to be pushed out of said discharging basket is lowered.

13. An apparatus as claimed in claim 2, wherein safety members are attached to said shelves of said charging and discharging baskets.

* * * * *